United States Patent [19]
Tsuji

[11] Patent Number: 5,514,625
[45] Date of Patent: May 7, 1996

[54] METHOD OF FORMING A WIRING LAYER

[75] Inventor: Hitoshi Tsuji, Kawasaki, Japan

[73] Assignee: Kabushiki Kaisha Toshiba, Kawasaki, Japan

[21] Appl. No.: 404,606

[22] Filed: Mar. 15, 1995

[30] Foreign Application Priority Data

Mar. 16, 1994 [JP] Japan ..................... 6-044607

[51] Int. Cl.⁶ ............... H01L 21/28; H01L 21/31
[52] U.S. Cl. .............. 437/195; 437/228; 437/229; 156/659.11
[58] Field of Search .................. 437/195, 228, 437/229, 228 M, 228 W; 156/644.1, 659.11, 661.11, 653.1

[56] References Cited

U.S. PATENT DOCUMENTS

| | | | |
|---|---|---|---|
| 4,985,374 | 1/1991 | Tsuji et al. | 437/229 |
| 4,999,318 | 3/1991 | Takahumi et al. | 437/194 |
| 5,055,426 | 10/1991 | Manning | 437/195 |
| 5,126,006 | 6/1992 | Cronin et al. | 156/643 |

Primary Examiner—T. N. Quach
Attorney, Agent, or Firm—Finnegan, Henderson, Farabow, Garrett & Dunner

[57] ABSTRACT

A novolak-based resist layer is formed on an interlayer insulating film, and that portion of the resist layer which is left as a resist mask for a wiring layer groove is formed by the first exposure and the heat treatment in an ammonia atmosphere. Thus, the solution rate of that portion of the resist layer is rendered low with regard to the alkali developing solution. Subsequently, the resist layer is exposed and developed in a regular manner to form a resist mask for defining a contact hole. With the obtained resist pattern used as a mask, the interlayer insulating film is etched to a depth which equals to a length of a contact hole in the depth direction formed at a later step. After that, with use of the resist pattern whose solution rate with respect to the alkali developing solution has been made low as a mask, the wiring layer groove is formed. With the method, a mask resist pattern used for defining a contact hole can be formed in a predetermined region, even if the exposure of the resist layer is displaced from the position where it should have been. Further, no step portion is created between the contact hole and the wiring groove.

14 Claims, 5 Drawing Sheets

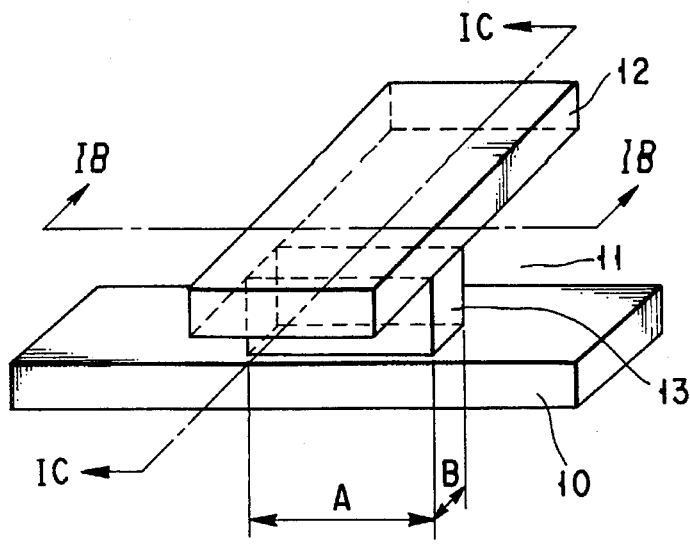
FIG. 1A
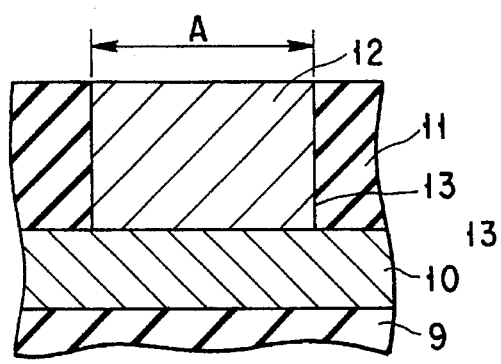 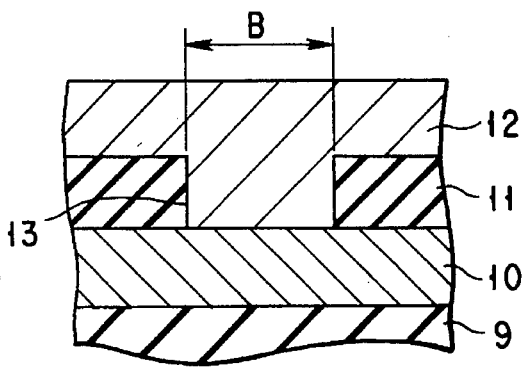
FIG. 1B  FIG. 1C
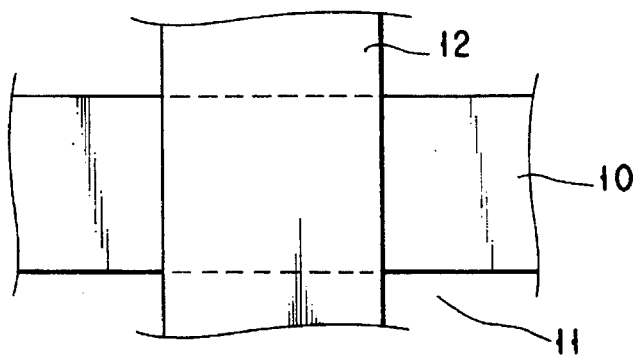
FIG. 1D

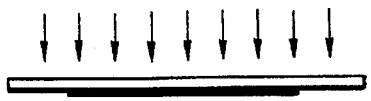
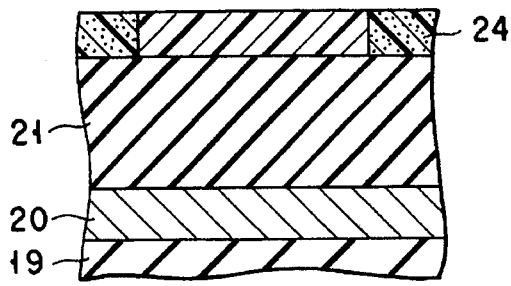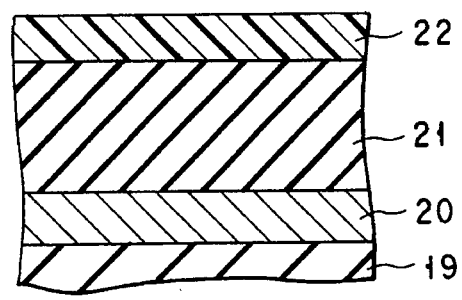
FIG. 2A    FIG. 2B
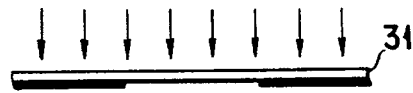
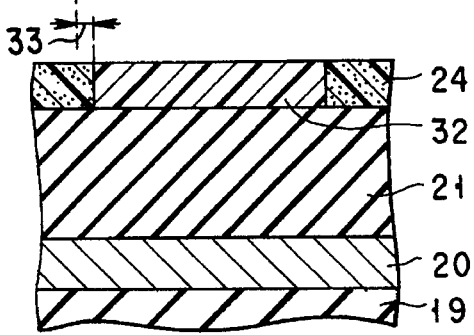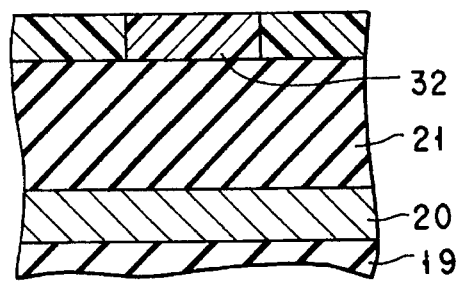
FIG. 3A    FIG. 3B
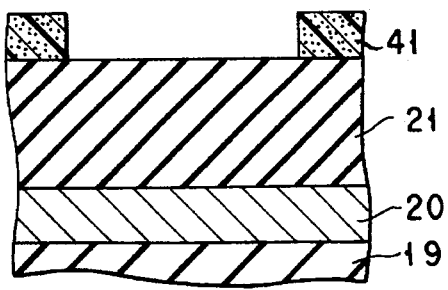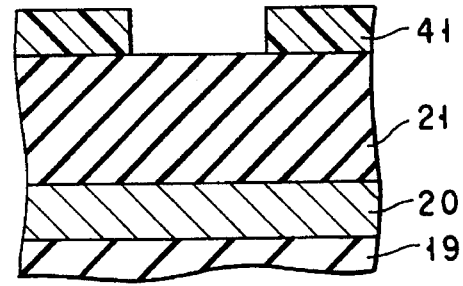
FIG. 4A    FIG. 4B
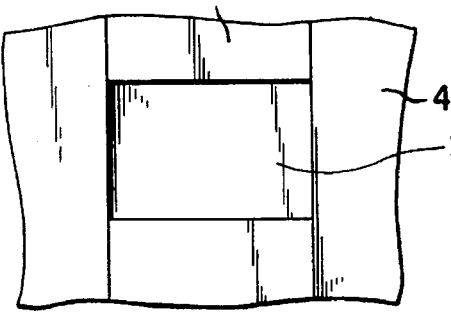
FIG. 4C

METHOD OF FORMING A WIRING LAYER

BACKGROUND OF THE INVENTION

1. Field of the Invention

The present invention relates to a method of forming a multilayer structure of wirings, in particular, of a semiconductor device.

2. Description of the Related Art

Presently, there is a demand of reducing a semiconductor element in size, and accordingly, there is a demand of downsizing a contact hole and a wiring layer. FIGS. 10A to 10D and 11A to 11D illustrate conventional and general methods of forming a multi-layer structure of wiring patterns.

That is, a resist pattern 103 for defining a contact hole 102 (FIG. 10B) is formed at a predetermined position of an interlayer insulating film 101 as shown in FIG. 10A. With use of this resist pattern as a mask, a contact hole 102 is formed in the interlayer insulating film 101 as shown in FIG. 10B. After removing the resist pattern 103, a wiring metal e.g. aluminum is deposited on the entire surface such that the wiring metal layer 104 and the underlying wiring layer 105 are rendered conductive. Subsequently, a resist pattern 106 having a predetermined pattern is formed on the wiring metal layer 104. With use of this resist pattern 106 as a mask, the wiring metal layer 104 is etched, thus forming a wiring layer 107.

However, the above-described conventional technique entails the problems of a low mask alignment accuracy at the time of actual processing, and the downsizing of designing margin is difficult. Further, this technique requires a step of widening the top opening portion of the contact hole 102 as shown in FIG. 10B for the purpose of sufficiently filling the contact hole with the wiring metal. Further, as the diameter of the contact hole is reduced, the contact hole is not fully filled with the wiring metal due to the over-bump portion of the wiring metal formed in the periphery of the opening portion of the contact hole, thus creating a void in the contact hole. As a result, the conduction between the wiring metal layer 104 and the underlying wiring layer 105 may not be achieved, thus degrading the electrical characteristics and the quality of the product semiconductor device. In order to solve this drawback, there is proposed a technique of depositing a metal at a high temperature, or a technique of depositing a metal at a standard temperature and then melting the metal layer. However, with these techniques, the mask alignment mark is covered by melted metal, and therefore it is difficult to find the mask alignment mark during a patterning operation of the resist on the metal layer, which takes places later, and in the worst case, the mask alignment cannot be found.

In another conventional method illustrated in FIGS. 11A to 11D, a pattern of a contact hole (FIG. 11A) is defined on the interlayer insulating film 201 using resist pattern 203 with use of the resist pattern 203 as a mask, the interlayer insulating film 201 is etched to a depth which equals to the length of a contact hole in the depth direction formed later. The line 202 denotes the center of a predetermined contact hole forming position. In the actual production step, an alignment mark on a semiconductor substrate is used as a line denoting the center of the contact hole forming position. After removing resist pattern 203, resist pattern 205 is formed on the interlayer insulating film 201 so as to define a pattern of a groove for an overlying wiring layer. In this case, the resist pattern may be displaced from a predetermined portion as shown in FIG. 11B. With use of this resist pattern as a mask, the interlayer insulating film 201 is further etched so that a through-hole is formed in the interlayer insulating film 201, as shown in FIG. 11C. The through-hole includes the groove 206 for the overlying wiring layer and contact hole 204 continuous to the wiring layer groove 206, and passes therethrough to an underlying wiring layer 207. The length of the further etched portion in the depth direction equals to the length of the wiring layer groove in the depth direction. After removing the resist pattern 205, a wiring metal layer 208 is deposited such that the conduction between the metal layer 208 and the underlying wiring layer 207 are rendered conductive (FIG. 11C). Then, the wiring metal layer 208 is melted and allowed to flow into the wiring layer groove 206 and the contact hole 204, and polishing is carried out. Thus, a conductive layer 209 for contact and a wiring layer 300 are formed in the interlayer insulation film 201, as shown in FIG. 11D.

The forming method illustrated in FIGS. 11A to 11D has been proposed so as to solve the problems with the method shown in FIGS. 10A to 10D. With this forming method, however, the patterning of the resist layer must be carried out two times: one for forming a contact hole and another one for forming a wiring layer groove. Therefore, in consideration of a mask alignment error, it is necessary to design a contact hole which is smaller than the width of the wiring layer. However, in the case where a contact hole smaller than the width of the wiring layer is designed, a step portion is created between the contact hole and the wring layer groove. As a result, during the deposition of the wiring metal layer or in the metal melting step for filling the groove with wiring metal, the problem of the contact hole being not filled completely with the wiring metal, may occur in some cases. Further, it is necessary to form a fine wiring layer resist pattern on the step portion in which the pattern of the contact hole is formed. In the case where the wiring layer resist pattern is displaced from the position where it should originally be formed, a part of the resist enters the contact hole as shown in FIG. 11B, and in this case, that part of the resist remains in the bottom portion of the contact hole. Further, due to the resist alignment error i.e. a resist misalignment, the wiring layer groove and the contact hole are formed in a different position from where it is designed.

As described above, with the conventional wiring layer forming method, it is difficult to downsize the wiring layer groove or contact hole, or to avoid an error in the resist mask alignment. Further, even if they are reduced in size, the contact hole is not filled completely with metal during the deposition of wiring metal, raising the problem of degrading the electrical characteristics and quality of the product. Furthermore, it is necessary to form a fine wiring layer groove on the step portion in which the pattern of the contact hole is formed, or some of the resist may remain in the bottom portion of the contact hole.

SUMMARY OF THE INVENTION

The present invention has been proposed in consideration of the above-described circumstances, and an object thereof is to provide a wiring layer forming method capable of forming a wiring layer groove or a contact hole at a desired position without being influenced by a mask alignment error i.e. a mark misalignment. Another object thereof is to provide a wiring layer forming method of forming a contact hole having a diameter which is the same as the width of a wiring groove so as to avoid the step portion between the contact hole and the wiring layer groove, thus achieving a complete conduction between the wiring metal layer and the underlying wiring layer. Still another object is to provide a wiring forming method by which some of the resist does not remain in the contact hole.

In order to achieve the above objects, a positive-type novolak resist is used in the present invention. The positive-type novolak resist has such characteristics that the photosensitive agent of the resist reacts itself by the light energy at the portion exposed to light, to make the photosensitive agent easily dissolved into an alkali developing solution. However, if, in that state, the photosensitive agent is not developed, but subject to a heat treatment at high temperature in an ammonia atmosphere, a decarbonizing reaction occurs to lower a solution rate of the agent with respect to the alkali developing solution. Further, the photosensitive agent contained in the positive novolak resist does not recover its original properties if exposed to light once again. In other words, the agent maintains the above feature that the agent has the low solution rate with regard to alkali developing solution when exposed to light once again.

The present invention has been achieved based on this feature. According to the present invention, a resist layer having particular characteristics is formed on an interlayer insulating film, and that portion of the resist layer which is left as a resist mask for a wiring layer groove is formed by the first exposure and the heat treatment in an ammonia atmosphere. Thus, the solution rate of that portion of the resist layer is rendered low with regard to the alkali developing solution. Subsequently, the resist layer is exposed and developed in a regular manner to form a resist mask for defining a contact hole. With the obtained resist pattern used as a mask, the interlayer insulating film is etched to a depth which equals to a length of a contact hole in the depth direction formed at a later step. After that, with use of the resist pattern whose solution rate with respect to the alkali developing solution has been made low as a mask, the wiring layer groove is formed.

According to the present invention, a solution rate of the portion of the resist pattern which is left in order to form the wiring layer groove, is made low with respect to the alkali developing solution by the first exposure and the heat treatment carried out in an ammonia atmosphere with such a structure, even if the location of the exposure is displaced, a resist pattern used for masking a contact hole, having a desired area and the same measure as the width of the wiring layer, and which is free of alignment errors, can be formed at a desired position, by setting the area of the exposure larger than that of the contact hole. Further, with this operation, no step portion is created between the contact hole and the wiring groove, and therefore a complete conduction between the wiring metal layer and the underlying wiring layer can be achieved. Furthermore, it suffices only if a resist is applied once. Also, since the application of the resist pattern is carried out before etching, no resist remains in the contact hole.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 1A is a perspective view of a multilayer wiring structure;

FIG. 1B is a cross section taken along the line IB—IB of FIG. 1A;

FIG. 1C is a cross section taken along the line IC—IC of FIG. 1A;

FIG. 1D is a diagram showing a top view of the structure shown in FIG. 1A;

FIGS. 2A and 2B are cross sections of the structure illustrating one production step of a wiring layer forming method according to the present invention;

FIGS. 3A and 3B are cross sections of the structure illustrating one production step of a wiring layer forming method according to the present invention;

FIGS. 4A and 4B are cross sections of the structure illustrating one production step of a wiring layer forming method according to the present invention;

FIG. 4C is a top view of the structure illustrating the production step shown in FIGS. 4A and 4B;

DETAILED DESCRIPTION OF THE PREFERRED EMBODIMENT

Figure 5A:
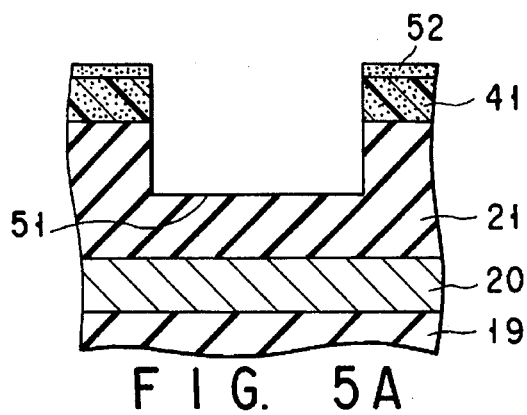
FIGS. 5A and 5B are cross sections of the structure illustrating one production step of a wiring layer forming method according to the present invention.

An embodiment of the present invention will now be described with reference to accompanying drawings.

FIG. 1A is a diagram showing a perspective view of wiring layers 10 and 12 and a contact hole 13 only, excluding an interlayer insulating film 11. FIG. 1B is a partial cross section of what is shown in FIG. 1A, taken along the line IB—IB, FIG. 1C is a partial cross section of what is shown in FIG. 1A, taken along the line IC—IC, and FIG. 1D is a diagram showing an upper surface of what is shown in FIG. 1A. As shown in FIG. 1A, the measure of the contact hole 13 in the lateral direction is set at A, and that of the longitudinal direction is set at B. This figure depicts a wiring metal layer 12 of, typically, Al and a contact hole 13, and an interlayer insulating film 11 (not shown) is present therearound. FIGS. 2A, 3A, 4A, 5A, 6A, 7A, 8A, and 9A are cross sections of the above members in production steps, taken along the line IB—IB, and FIGS. 2B, 3B, 4B, 5B, 6B, 7B, 8B, and 9B are cross sections of the above members in production steps, taken along the line IC—IC. FIGS. 4C and 7C show top views.

As shown in FIGS. 2A and 2B, a metal such as aluminum is deposited on a substrate layer 19 (which is an insulating film in this embodiment) made of a semiconductor substrate, a polysilicon layer or an insulating layer by, for example, CVD (Chemical Vapor Deposition). Thus formed metal layer is patterned to form an underlying wiring layer 20, which is a first wiring layer. An interlayer insulating film 21 in which a contact hole and a wiring layer are formed at later steps, is formed on an insulating film 19 including the underlying wiring layer 20. A positive-type novolak photoresist (to be called resist hereinafter) is applied on the interlayer insulating film 21, thus forming a resist layer 22. The resist layer 22 contains two components, a novolak resin and a photosensitive agent. The g ray or i ray is used as an exposure light beam for the resist layer 22. In this embodiment, the g ray exposure is carried out. With use of a g ray stepper (not shown) for the first exposure, the resist layer 22 is exposed to light, with the aid of a pattern as a first mask 23, formed so that the exposure light is not irradiated on that region of the resist layer 22 which is on that region of the interlayer insulating film 21 where a groove for a wiring layer is later formed. Then, without carrying out development, a heat treatment is carried out in the following manner. That is, with use of an oven device (not shown) having a vacuum function, the substrate of the above-described structure is placed in the oven having an atmosphere in which oxygen, hydrogen and the like are eliminated, ammonia gas is introduced into the oven from a chamber (not shown), and the heat treatment is carried out at a temperature within a range of 90° to 110° C. for about 45 minutes. After the heat treatment, the solution rate of only the region of the resist layer 24 which was exposed to the light, namely the solution rate of a resist pattern for forming a wiring groove, is rendered low to an alkali based developing solution. However, the rest of the resist layer 24, namely, the resist layer portion (not exposed portion) for forming the wiring layer groove, is not modified in the properties.

Next, the substrate is set back to the room temperature, and the second exposure is carried out on the resist film 22 with use of a second mask 31 having a pattern such that an exposure light beam is irradiated on that region of the resist layer 22 which is on that region of the interlayer insulating film 21 where a contact hole is later formed, as shown in FIG. 3A and 3B. The region 32 of the resist layer 22 which has been subjected to the second exposure is developed in the following step with an alkali-based development solution. The low solution rate to alkali, of the resist pattern 24 for forming a wiring layer groove is not varied by the second exposure, but is maintained as it has been. In other words, the low solution rate to alkali is not lost by the second exposure. Consequently, the light transmissible portion of the mask, a cross section of which is shown in FIG. 3A, can be designed to have a measure larger than the width of the contact hole, in consideration of a possible offset of the second mask 31, as indicated by reference numeral 33. Therefore, even if the mask is displaced somewhat from a predetermined region in which the contact hole is formed, the problem in which the resist layer region to be exposed, is not exposed, or the like can be prevented, with the designing of the light transmissible portion of the mask being made large measure.

Next, the resist layer exposed to light in the steps shown in FIGS. 2A, 2B, 3A and 3B, is developed with an alkali-based developing solution. In the development, the resist layer portion other than the resist layer region which has been rendered insoluble to the alkali-based developing solution in the step shown in FIGS. 2A and 2B and the resist layer portion which is covered by the second mask 31 in the step shown in FIGS. 3A and 3B, is removed. Thus, a resist pattern 41 for defining a region in which the contact hole is formed, is prepared as shown in FIGS. 4A, 4B and 4C. In this case, the solution rate of the portion of the resist pattern 41 (the portion which defines the width of the contact hole in the lateral direction), shown in the cross section of FIG. 4A, that is, a cross section taken along the line IB—IB of FIG. 1A, has been rendered low with respect to the alkali-based developing solution by the first exposure and the heat treatment in the ammonia atmosphere, and therefore that portion remains after the development process. The width of the opening defined by the portion is thus the same as that of the resist pattern 24 shown in FIG. 2A. Consequently, the resist pattern 41 can be formed in a predetermined region to be used to form the contact hole, without an alignment error i.e. a misalignment, regarding the cross section of the resist pattern 41 shown in FIG. 4A, that is, the cross section taken along the line IB—IB of FIG. 1A. On the other hand, with regard to the cross section of the resist pattern 41 shown in FIG. 4B, that is, the cross section taken along the line IC—IC of FIG. 1A, a slight alignment error may result in the exposure steps shown in FIGS. 3A and 3B. However, with regard to this cross section, the contact hole is considered to be formed in the region where the conduction between the overlying wiring layer and the underlying wiring layer is achieved by a later step for depositing a metal, and therefore such a slight alignment error should not raise a serious problem. Thus, in the steps shown in FIGS. 2A and 2B, the mask 23 is set on a predetermined region for forming the contact hole in a no alignment error state, and the resist layer 22 is exposed. Consequently, the exposure in a later step can be carried out without precision mask alignment.

Figure 5B:
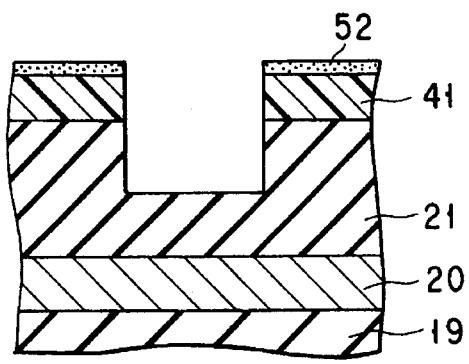

Next, with use of the resist pattern 41 formed by the development process shown in FIGS. 5A and 5B as a mask, the selected portion of the interlayer insulating film 21 is etched. In this case, since the pattern formed in the interlayer insulating film 21 by etching is made fine, anisotropy etching using plasma ions, for example, is carried out by using a magnetron RIE (Reactive Ion Etching) apparatus or an ECR (Electron Cyclotron Resonance) etching apparatus, so as to etch the selected portion of the interlayer insulating film 21 for a predetermined depth 51 equal to a distance between a surface layer of the underlying wiring layer 20 and a bottom surface of the wiring layer groove formed in a later step. That is, the depth 51 is equal to a length of the contact hole in the depth direction formed a later step. Subsequently, a modified surface region 52 of the resist layer 41, having a thickness of several tens of nm, which have been modified due to the shock by the plasma ions during the etching, is removed by RIE with oxygen gas or by ashing.

Figure 6A:
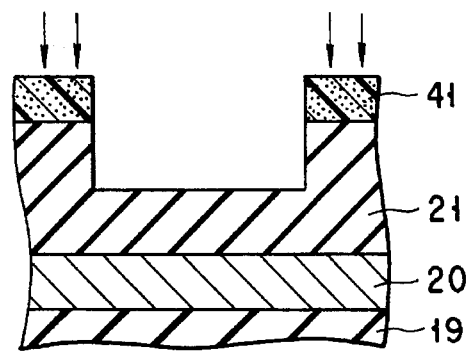
FIGS. 6A and 6B are cross sections of the structure illustrating one production step of a wiring layer forming method according to the present invention.
Figure 6B:
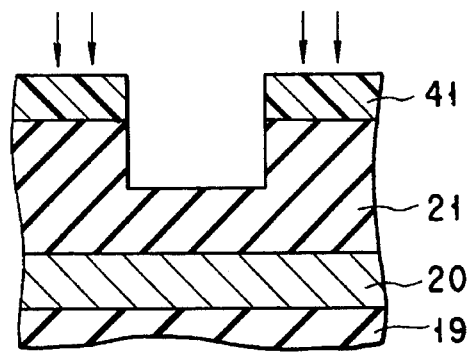

Next, as shown in FIGS. 6A and 6B, the third exposure is carried out. In this exposure, the entire surface is exposed with a mask having no pattern using a stepper, or the entire region of the remaining resist layer is exposed without using a mask, by a close type exposing device.

Figure 7A:
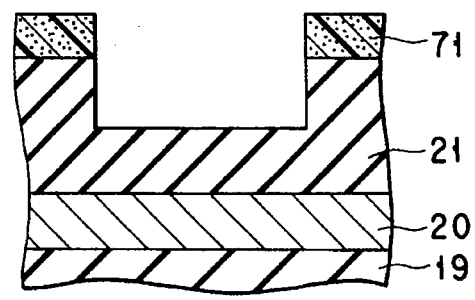
FIGS. 7A and 7B are cross sections of the structure illustrating one production step of a wiring layer forming method according to the present invention.
Figure 7B:
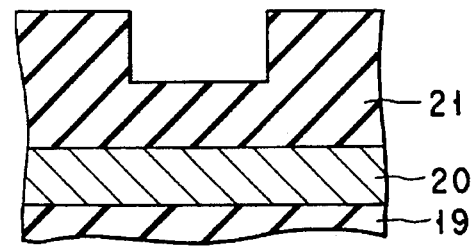
Figure 7C:
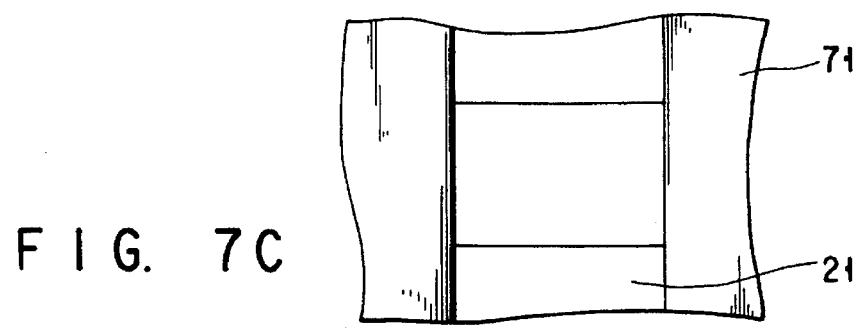
FIG. 7C is a top view of the structure illustrating the production step shown in FIGS. 7A and 7B.

Next, the resist pattern is developed with an alkali-based developing solution as shown in FIGS. 7A, 7B and 7C. In this development, only the resist layer portion which was exposed to the first exposure (exposing steps shown in FIGS. 2A and 2B) remain, thus forming a resist pattern 71 for defining a pattern of a wiring layer groove. That is, the resist pattern 71 has the low solution rate with regard to the alkali-based developing solution, and therefore it remains on the inter layer insulating film 21 even after this development process. The resist pattern 71 is identical to the resist pattern portion 41 which was used for defining the region in which the contact hole is formed. Therefore, a contact hole having the same width as that of the wiring layer groove can be formed. Accordingly, an undesired step portion is not created between the wiring layer groove and the contact hole.

Figure 8A:
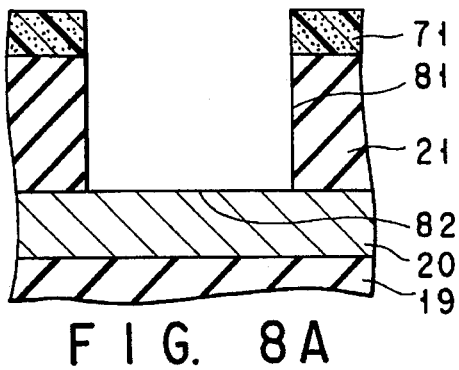
FIGS. 8A and 8B are cross sections of the structure illustrating one production step of a wiring layer forming method according to the present invention.
Figure 10A:
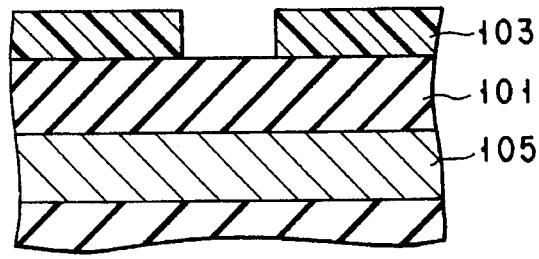
FIGS. 10A to 10D are cross sections of the structure illustrating each production step of a conventional wiring layer forming method.
Figure 8B:
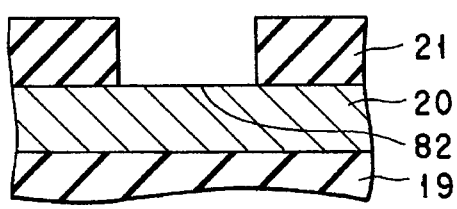
Figure 10B:
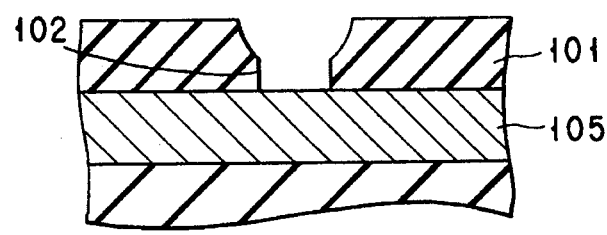

Next, as shown in FIGS. 8A and 8B, with use of the resist pattern 71 formed in the steps shown in FIGS. 7A and 7B as a mask, the interlayer insulating film 21 is etched by the anisotropy etching such as RIE until a through-hole 81 reaches a surface 82 of the underlying wiring layer 20.

Figure 9A:
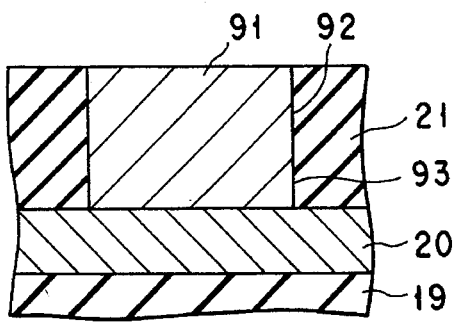
FIGS. 9A and 9B are cross sections of the structure illustrating one production step of a wiring layer forming method according to the present invention.
Figure 10C:
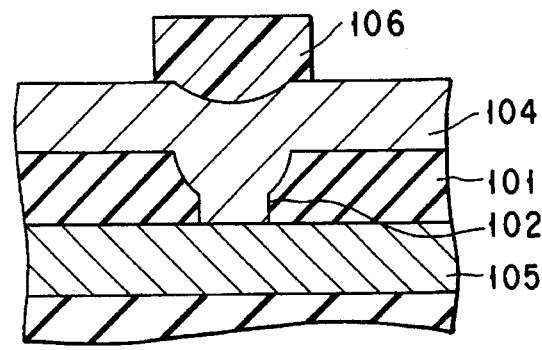
Figure 9B:
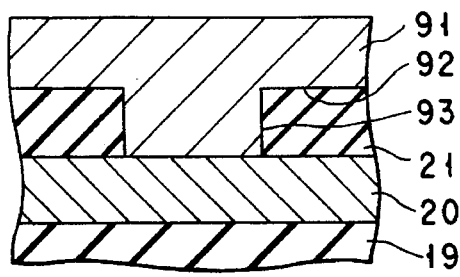
Figure 10D:
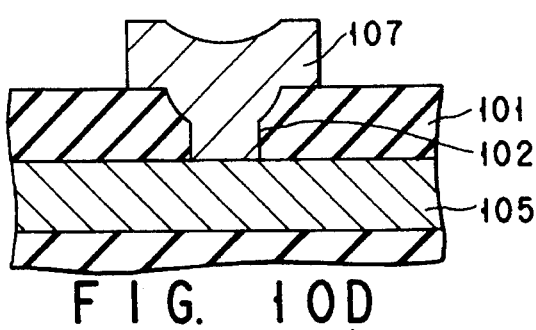
Figure 11A:
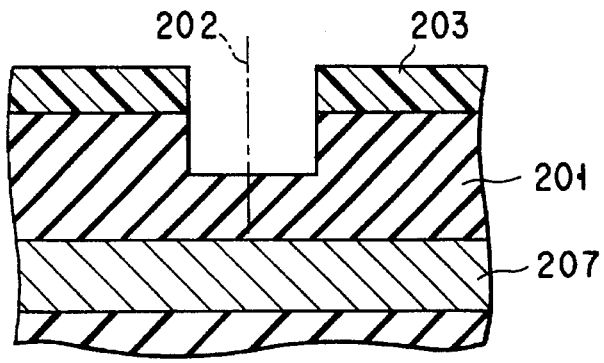
FIGS. 11A to 11D are cross sections of the structure illustrating each production step of another conventional wiring layer forming method.
Figure 11B:
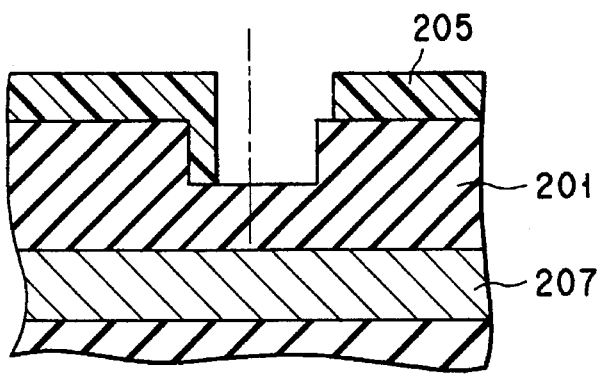
Figure 11C:
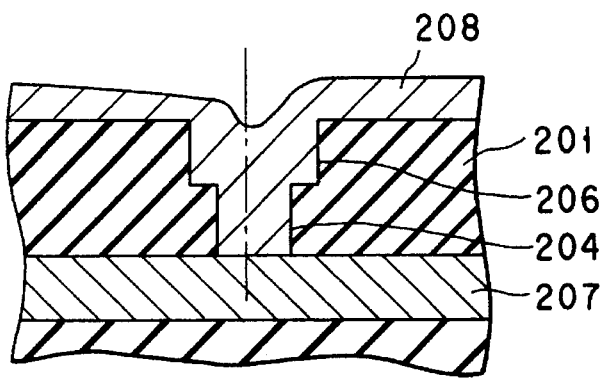
Figure 11D:
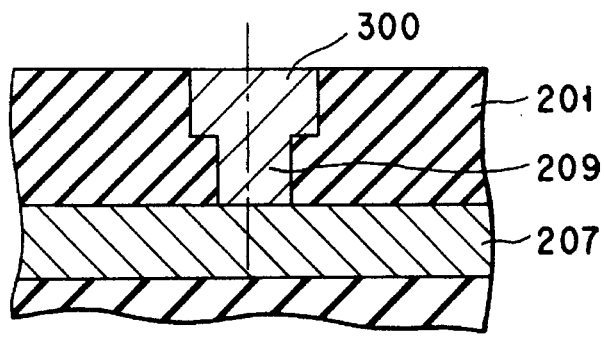

Next, as shown in FIG. 9A and 9B, the solution rate of the resist pattern 71 which has been rendered low with regard to the alkali-based developing solution is removed by ashing or the like. Then, an aluminum-based wiring metal 91 is deposited in the wiring groove 92 and the contact hole 93, and further, the metal is melted at a high temperature so as to fill the contact hole and the wiring groove completely with the wiring metal. After that, the polishing is carried out in order to smoothen the surface of the wiring metal. In the above-described step, a buried wiring layer is formed. It should be noted that Cu-based metal may be used in place of the aluminum-based metal.

As described above, according to the present invention, a contact hole can be formed at a predetermined position without an alignment error. Further, no step portion is created between the contact hole and the wiring layer groove, thereby achieving a perfect conduction between the overlying wiring layer and the underlying wiring layer. Furthermore, it suffices only if the application of a resist is carried out once, and resist does not remain in the contact hole.

Also, according to the present invention, a mask resist pattern used for forming a contact hole can be formed in a predetermined region with the same measure as the width of the wiring layer, without creating an alignment error i.e. a misalignment of the pattern of the contact hole, even if the exposure of the resist layer is displaced from the position where it should have been. Further, no step portion is created between the contact hole and the wiring layer groove, thus achieving a perfect conduction between the wiring metal and the underlying layer. Furthermore, it suffices only if the application of a resist is carried out once, and since, the resist is applied before the etching step, the resist is prevented from remaining in the contact hole.

Additional advantages and modifications will readily occur to those skilled in the art. Therefore, the invention in its broader aspects is not limited to the specific details and illustrated examples shown and described herein. Accordingly, various modifications may be made without departing from the spirit or scope of the general inventive concept as defined by the appended claims and their equivalents.

What is claimed is:

1. A method of forming a wiring layer comprising the steps of:

forming a first wiring layer on a substrate layer;

forming an interlayer insulating film on the first wiring layer;

forming a resist layer on the interlayer insulating film;

exposing the resist layer to light, using a first mask having a pattern corresponding to a groove formed later in the interlayer insulating film to provide a low solution rate in that portion of the resist layer which is other than a portion corresponding to the groove;

exposing the resist layer to light, using a second mask having a pattern corresponding to a contact hole in the groove and formed later in the interlayer insulating film and developing the resist layer using a developing solution, to form a first resist pattern corresponding to the pattern of the second mask;

etching a selected portion of the interlayer insulating film to a first depth, using the first resist pattern;

exposing the resist layer to light and developing the resist layer using a developing solution, to form a second resist pattern corresponding to the pattern of the first mask;

etching a selected portion of the interlayer insulating film to a second depth, using the second resist pattern, to form the contact hole and the groove in the interlayer insulating film;

removing the second resist pattern; and forming a second wiring layer by filling the contact hole and the groove with a wiring material.

2. A method according to claim 1, wherein, in the step of exposing the resist layer to light using the first mask, said portion of the resist layer is subjected to a heat treatment in an atmosphere of a gas, so as to make the solution rate of said portion of the resist layer lower with respect to a developing solution.

3. A method according to claim 2, wherein the atmosphere is an ammonia gas atmosphere.

4. A wiring layer forming method according to claim 1, wherein the first depth is equal to a distance between a surface of the first wiring layer and a bottom surface of the groove.

5. A wiring layer forming method according to claim 1, wherein the second depth is equal to a distance between a bottom surface of the groove and a surface of the interlayer insulating film.

6. A wiring layer forming method according to claim 1, wherein the first mask is a mask for shutting off the light on a portion of the resist layer, corresponding to the groove.

7. A wiring layer forming method according to claim 1, wherein the second mask is a mask for shutting off the light on a portion of the resist layer, corresponding to the contact hole.

8. A wiring layer forming method according to claim 1, wherein the first mask is a mask for shutting off the light on a portion of the resist layer, corresponding to the interlayer insulating film including the contact hole.

9. A method according to claim 1, wherein the resist layer is a positive-type novolak-type resist layer.

10. A method of forming a wiring layer comprising the steps of:

forming an interlayer insulating film having a first region and a second region, on a substrate layer;

forming a resist layer on the interlayer insulating film;

exposing a portion of the resist layer on the first region, to light;

making the portion of the resist layer on the first region, insoluble to a developing solution;

exposing a portion of the resist layer on a third region within the second region, to light;

forming a first resist pattern by developing the resist layer using the developing solution, and removing the resist portion on the third region;

etching a selected portion of the interlayer insulating film to a first depth, using the first resist pattern as a mask;

exposing the entire resist layer to light;

forming a second resist pattern by developing the resist layer using the developing solution, and removing the resist portion on the second region;

exposing the portion of the substrate layer under the third region by etching the selected portion of the interlayer insulating film using the second resist pattern as a mask; and filling the second region and the third region with a wiring material.

11. A method according to claim 10, wherein the step of making the portion of the resist layer on the first region insoluble, includes subjecting the resist layer to a heat treatment in an atmosphere of a gas, so as to make the portion of the resist layer on the first region insoluble to a developing solution.

12. A method according to claim 11, wherein the atmosphere of a gas is an atmosphere of ammonia gas.

13. A wiring layer forming method according to claim 9, wherein a wiring layer is formed on the exposed portion of the substrate layer under the third region.

14. A method according to claim 10, wherein the resist layer is a positive-type novolak-type photoresist layer.

* * * * *